(12) United States Patent
Taguchi

(10) Patent No.: US 6,459,556 B1
(45) Date of Patent: Oct. 1, 2002

(54) INPUT BUFFER

(75) Inventor: Hiroyuki Taguchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 59 days.

(21) Appl. No.: 09/605,954

(22) Filed: Jun. 28, 2000

(30) Foreign Application Priority Data

Jul. 22, 1999 (JP) .......................................... 11-207931

(51) Int. Cl.⁷ ................................................ H02H 3/20
(52) U.S. Cl. ....................................... 361/91.1; 327/89
(58) Field of Search ............................. 327/77, 78, 85, 327/89, 199, 208, 210; 330/252, 253; 361/91.1, 91.5

(56) References Cited

U.S. PATENT DOCUMENTS 5,942,921 A * 8/1999 Talaga, Jr. ................... 327/77
6,049,111 A * 4/2000 Higuchi et al. ............. 257/355
6,087,891 A * 7/2000 Yoon et al. .................. 327/530

* cited by examiner

Primary Examiner—Ronald W. Leja
(74) Attorney, Agent, or Firm—Fish & Richardson P.C.

(57) ABSTRACT

An input buffer having a differential amplifier 3 includes a protection circuit 4 located between an input terminal 1 and the differential amplifier. The protection circuit serves to protect a MOS transistor 5 constituting the differential amplifier when a high voltage is applied to the input terminal of the input buffer. The protection circuit is an N-channel type MOS transistor with a drain electrode connected to the input terminal, a source electrode connected to a gate terminal of the MOS transistor 5 constituting the differential amplifier 3 and a gate terminal supplied with a power source voltage Vcc. In this configuration, the input buffer prevents occurrence of an unnecessary through current.

2 Claims, 2 Drawing Sheets

INPUT BUFFER

BACKGROUND OF THE INVENTION

The present invention relates to an input buffer, installed in a semiconductor integrated circuit, for shaping a signal in a TTL level (transistor-transistor logic) externally supplied to an internal signal in a COMS level to be outputted.

A semiconductor storage device which is typical as a semiconductor integrated circuit is activated in accordance with signals such as an address, control signal, data, etc. which are supplied from a connected system, and makes the corresponding operation such as read/write. In this case, the signal supplied from the system generally has a signal level of TTL. Therefore, in order to operate a CMOS circuit within the semiconductor storage device on the basis of the TTL level signal, it is necessary to provide an input buffer for shaping the input signal in the TTL level into an internal signal in a CMOS level. Such an input buffer is coupled with an input terminal of the semiconductor storage device to shape the address, control signal, data, etc. supplied through the input terminal.

FIG. 3 is a circuit diagram for explaining the configuration of a conventional input buffer.

In FIG. 3, reference numeral 11 denotes a P-channel type MOS transistor and reference numeral 12 denotes an N-channel MOS transistor.

A power source voltage Vcc is applied to the source terminal of the P-channel type MOS transistor 11 and a grounding voltage Vss is applied to the source terminal of the N-channel type MOS transistor 12.

The gate terminal of the P-channel type MOS transistor 11 and that of the N-channel type MOS transistor 12 are commonly connected to an input terminal IN 14 through a transfer gate 13 which is an N-channel type MOS transistor with the power source voltage Vcc applied to a gate terminal. The drain terminal of the P-channel type MOS transistor 11 and that of the N-channel type MOS transistor 12 are commonly connected to an output terminal OUT 15.

Meanwhile, in order to assure a high input voltage in a device microstructure, it was necessary to provide a transfer gate 13 at the front stage of the input buffer thereby to reduce the voltage applied to the gate terminal.

The above inverter-type input buffer presents the following problem. The input buffer adopts the circuit configuration including a transfer gate 13 serving as a protection circuit at the front stage of the CMOS inverter to which the input terminal 14 is connected. Therefore, where the gate potential of the transfer gate 13 is set at the power source voltage Vcc and the input signal to the input terminal IN 14 is Vcc, the gate input of the CMOS inverter is Vcc−Vtn (Vtn: threshold voltage of the N-channel type MOS transistor constituting the transfer gate 13) so that the P-channel type MOS transistor 11 turns on. Thus, a through current flows.

In order to prevent the above mentioned through current, a feedback transistor may be provided between the output terminal and the gate terminals of the P-MOS transistor 11 as shown in FIG. 3B. However, in this case, the threshold of the N-MOS transistor 13 is difficult to set. Thus, design margin is restricted.

SUMMARY OF THE INVENTION

An object of the present invention is to provide an input buffer provided with a protection circuit which can suppress flow of an unnecessary through current due to the protection circuit.

In order to attain the above object, in accordance with the present invention, there is provided a differential input buffer having a differential amplifier 3 comprising: a protection circuit 4 located between an input terminal 1 and the differential amplifier, the protection circuit serving to protect a MOS transistor 5 constituting the differential amplifier when a high voltage is applied to the input terminal. Preferably, the protection circuit is an N-channel type MOS transistor with a drain electrode connected to the input terminal, a source electrode connected to a gate terminal of an N-channel type MOS transistor 5 constituting the differential amplifier 3 and a gate terminal supplied with a power source voltage Vcc. Preferably, a higher internal boosted voltage Vpp than the power source voltage is applied to the gate terminal of the N-channel type MOS transistor constituting the protection circuit.

In accordance with the invention, when a high voltage is applied to an input terminal, it is possible to suppress occurrence of the unnecessary through current owing to the protection circuit for protecting the MOS transistor constituting the differential amplifier, which is located between the input terminal and the differential amplifier.

By applying a higher voltage than a power source voltage to the gate terminal of the N-channel type MOS transistor serving as the protection circuit, it is possible to suppress the reduction in the capability of the differential input buffer during the low voltage operation which is due to the reduction in the input signal by the threshold value of the N-channel type MOS transistor.

DETAILED DESCRIPTION OF THE PREFERRED EMBODIMENTS

Figure 1:
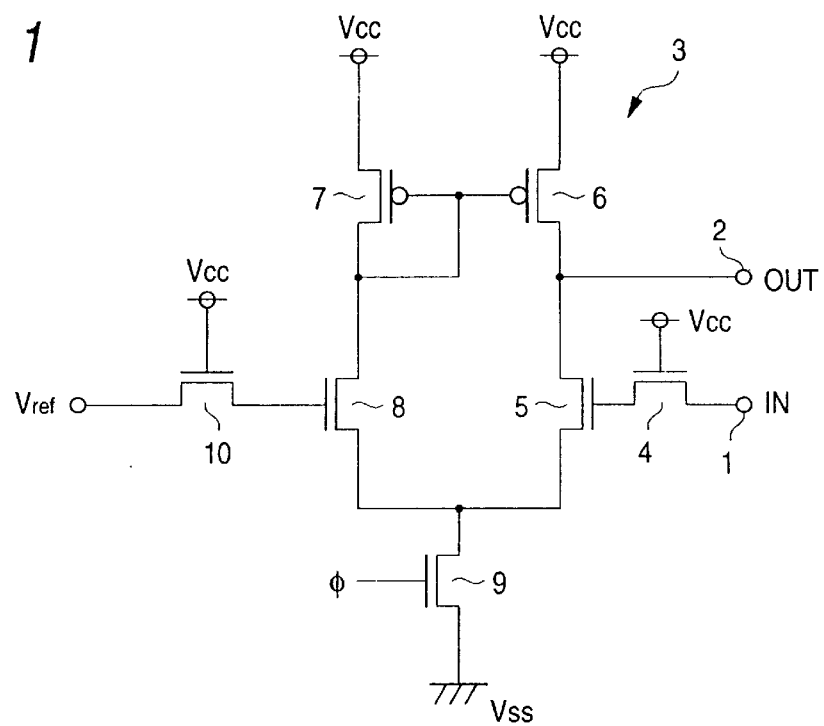
FIG. 1 is a circuit diagram of the input buffer according to an embodiment of the invention.

Now referring to the drawings, an explanation will be given of an embodiment of the input buffer according to the invention.

In FIG. 1, reference numeral 1 denotes an input terminal IN to which an input signal is applied; 2 an output terminal OUT from which an output signal is produced; and 3 a differential amplifier arranged between the input terminal 1 and the output terminal 2. It should be noted that an input voltage up to about 5.5 V is applied to the input terminal 1.

In this way, the input buffer according to the present invention is a differential input buffer having a differential amplifier 3 as a component. The input buffer has a protection circuit 4 provided between the input terminal 1 and the differential amplifier 3 in order to prevent the gate breakdown of a MOS transistor serving as the differential amplifier 3 when a high voltage is applied to the input terminal 1.

Now, the differential amplifier 3, which has a well known circuit configuration, will not described in detail here, has a current mirror circuit configuration.

Reference numeral 6 denotes a P-channel type MOS transistor with a source electrode supplied with a power source voltage Vcc (set at about 3.0–3.6 V). Reference numeral 5 denotes a N-channel type MOS transistor which constitute the differential amplifier, with the gate supplied with the input signal from the input terminal 1 through the protection circuit 4. A drain electrode of the P-MOS transistor 6 is commonly connected to the drain electrode of the N-channel type MOS transistor 5, and a gate terminal of the P-MOS transistor 6 is also commonly connected to a gate terminal a P-channel type MOS transistor 7. The P-channel type MOS transistor 6 constitutes a current path on a comparison side, and the P-channel type MOS transistor 7 constitutes another current path on the reference side.

The source electrode of the N-channel type MOS transistor 5 is commonly connected to the source electrode of the N-channel type MOS transistor 8 which constitutes a current path on the reference side, and connected to ground Vss through an N-channel type MOS transistor 9 with a gate supplied with a control signal φ.

Between the drain electrode of the P-channel type MOS transistor 7 and the drain electrode of the N-channel type MOS transistor 8, the gate of the P-channel type MOS transistor 6 and the gate of the P-channel type MOS transistor 7 are commonly connected to each other.

The gate of the N-channel type MOS transistor 8 is supplied with a reference voltage Vref (set at about 1.4 V) through the N-channel type MOS transistor 10. The N-channel type MOS transistor 10 is inserted taking the symmetry with the N-channel type MOS transistor serving as the protection circuit 4 into consideration. It is not indispensable to the circuit configuration and hence can be removed.

An explanation will be given of the circuit operation of the above input buffer.

First, when the N-channel type MOS transistor 9, which is turned on/off according to the state of the control signal φ supplied to its gate, turns on, the current path (P-channel type MOS transistor 6 and N-channel type MOS transistor 5) on the comparison side and that (P-channel type MOS transistor 7 and N-channel type MOS transistor 8) on the reference side are connected to ground.

In this state, the input signal at the input terminal 1 is supplied to the gate of the N-channel type MOS transistor 5 constituting the current path on the comparison side through the protection circuit (N-channel type MOS transistor) 4 (which produces Vcc−Vtn). At this time, the gate of the N-channel type MOS transistor 8 constituting the current path on the reference side is supplied with a reference voltage Vref (about 1.4 V) through the N-channel type MOS transistor 10. The reference voltage Vref, which is much lower than the power source voltage Vcc (about 3.0–3.6 V) applied to the gate terminal of the N-channel type MOS transistor 10, is not reduced in its threshold value, but supplied, as it is, to the gate of the N-channel type MOS transistor 8.

The input voltage is compared with the reference voltage Vref. If the input voltage is higher (at a higher level) than the reference voltage Vref, the N-channel type MOS transistor 5 is driven more strongly than the N-channel type MOS transistor 8 (pulled toward the side of the ground Vss) so that the signal at a low level is produced at the output terminal 2.

If the input voltage is lower (at a lower level) than the reference voltage Vref, the P-channel type MOS transistor 6 is driven more strongly than the P-channel type MOS transistor 7 (supplied with the power source voltage Vcc to a higher degree) so that the signal at a high level is produced at the output terminal 2.

In accordance with the input buffer according to the invention having the circuit configuration as described above, when a high voltage is applied to the input terminal 1, it is possible to suppress occurrence of the unnecessary through current owing to the protection circuit (N-channel type MOS transistor 4) for protecting the N-channel type MOS transistor 5 constituting the differential amplifier 3, which is located between the input terminal 1 and the differential amplifier 3, i.e. at the previous stage of the differential amplifier 3.

In the above embodiment, the power source voltage Vcc was applied to the gate terminal of the protection circuit (N-channel type MOS transistor) 4. Now referring to FIG. 2, the other embodiment will be explained below.

Figure 2:
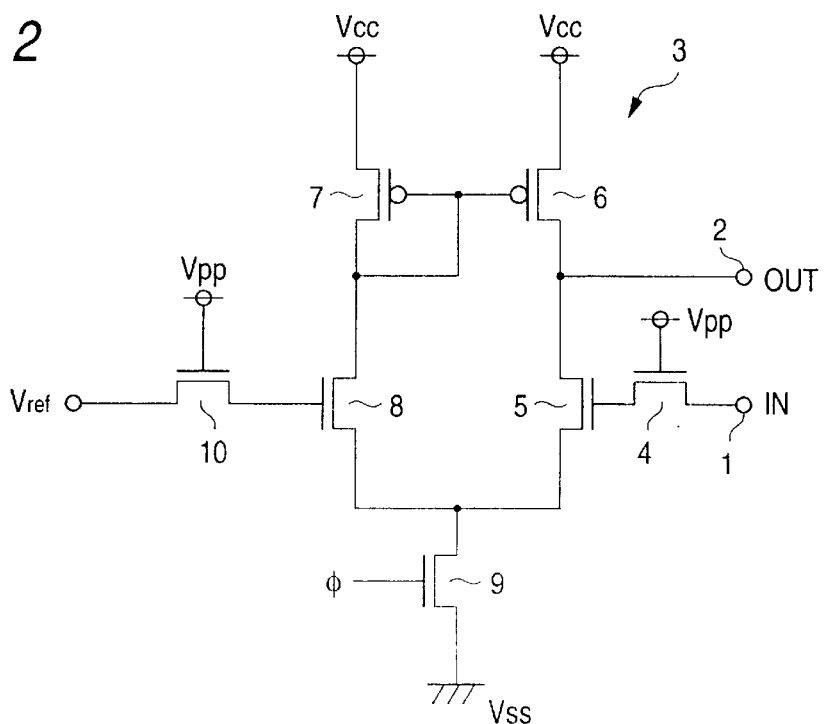
FIG. 2 is a circuit diagram of the input buffer according to another embodiment of the invention.
Figure 3A:
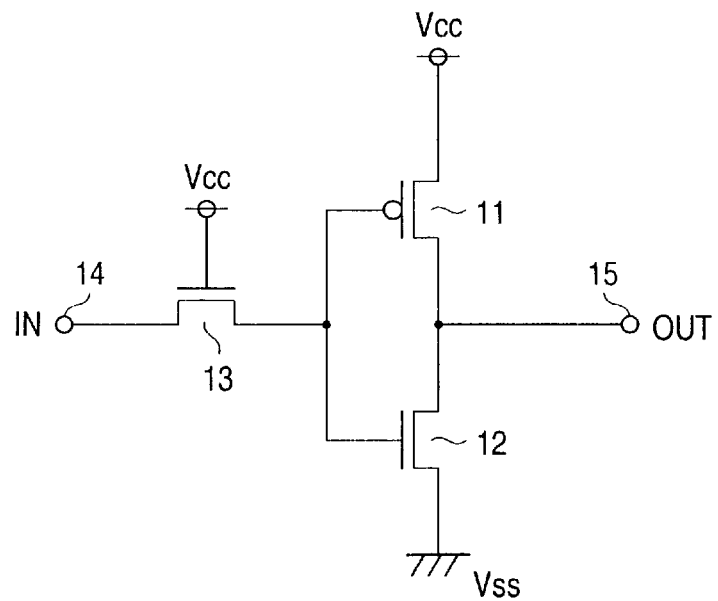
FIGS. 3A and 3B are circuit diagrams of a conventional input buffer.
Figure 3B:
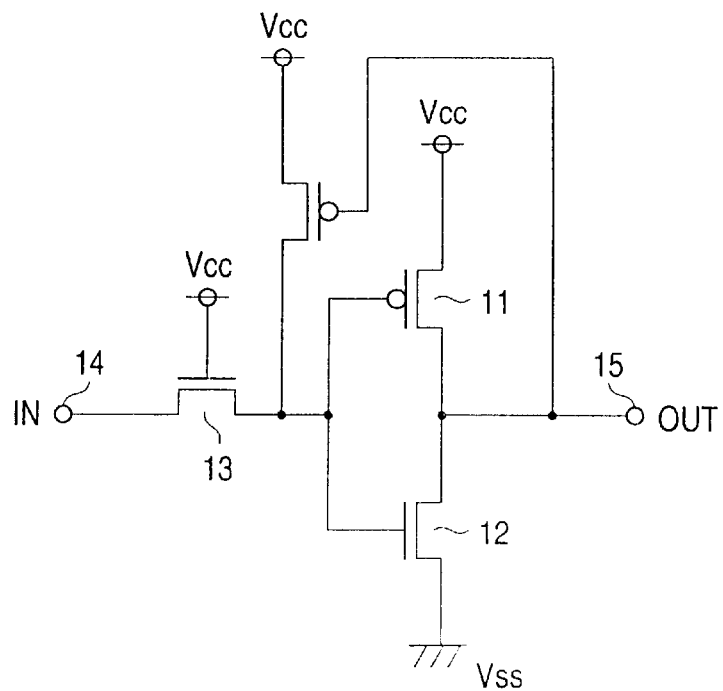

The feature of the other embodiment resides in that as shown in FIG. 2, an internal boosted voltage Vpp (Vpp>Vcc) which is obtained by boosting the power source voltage Vcc through an internal voltage boosting circuit (not shown) is applied to the gate terminal of the protection circuit (N-channel type MOS transistor). In such a circuit configuration, it is possible to assure the margin for comparison with the current path on the reference side, which is due to the reduction in the input signal supplied to the input terminal 1 by the threshold value of the N-channel type MOS transistor constituting the protection circuit. This is effective during the low voltage operation.

What is claimed is:

1. An input buffer comprising:
   an input terminal;
   a differential amplifier including a plurality of MOS transistors, said differential amplifier comprising a current mirror circuit, in that a reference voltage is applied to one side of the current mirror circuit;
   a protection circuit located between said input terminal and the other side of the differential amplifier, said protection circuit serving to protect a MOS transistor constituting the differential amplifier when a high voltage is applied to the input terminal; and
   a control transistor connected between said differential amplifier and a ground, a control signal is supplied to a gate thereof,
   wherein said protection circuit is an N-channel type MOS transistor of which a drain electrode is connected to said input terminal, a source electrode is connected to a gate terminal of an N-channel type MOS transistor constituting said differential amplifier, and a gate terminal is applied with a power source voltage.

2. An input buffer according to claim 1, wherein said power source voltage is higher than a power source voltage of the differential amplifier.

* * * * *